US006721203B1

United States Patent
Qi et al.

(10) Patent No.: US 6,721,203 B1
(45) Date of Patent: Apr. 13, 2004

(54) DESIGNS OF REFERENCE CELLS FOR MAGNETIC TUNNEL JUNCTION (MTJ) MRAM

(75) Inventors: Qiuqun Qi, Fremont, CA (US); Xizeng Shi, Fremont, CA (US); Matthew R. Gibbons, Livermore, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 120 days.

(21) Appl. No.: 10/017,647

(22) Filed: Dec. 12, 2001

Related U.S. Application Data

(60) Provisional application No. 60/271,169, filed on Feb. 23, 2001.

(51) Int. Cl.[7] .............................................. G11C 11/15
(52) U.S. Cl. ........................ 365/173; 365/158; 365/209
(58) Field of Search ................................ 365/210, 209, 365/173, 158, 171

(56) References Cited

U.S. PATENT DOCUMENTS

| | | | |
|---|---|---|---|
| 5,940,319 A | 8/1999 | Durlam et al. | |
| 6,174,737 B1 | 1/2001 | Durlam et al. | |
| 6,185,143 B1 | 2/2001 | Perner et al. | |
| 6,317,376 B1 | 11/2001 | Tran et al. | |
| 6,392,924 B1 * | 5/2002 | Liu et al. | 365/158 |
| 6,496,436 B2 * | 12/2002 | Naji | 365/209 |
| 6,532,164 B2 * | 3/2003 | Redon et al. | 365/97 |
| 6,552,928 B1 * | 4/2003 | Qi et al. | 365/171 |

* cited by examiner

*Primary Examiner*—Michael S. Lebentritt
*Assistant Examiner*—Hien Nguyen
(74) *Attorney, Agent, or Firm*—Carr & Ferrell LLP

(57) ABSTRACT

A reference cell circuit for a magnetic tunnel junction MRAM includes a first magnetic tunnel junction device set to a low resistance state and a second magnetic tunnel junction device set to a high resistance state. A reference cell series unit includes the first magnetic tunnel junction device electrically coupled in series with the second magnetic tunnel junction device. The reference cell series unit further has a first end and a second end with the first end being electrically coupled to a first current source and the second end being electrically coupled to a current sink and a second current source.

41 Claims, 7 Drawing Sheets

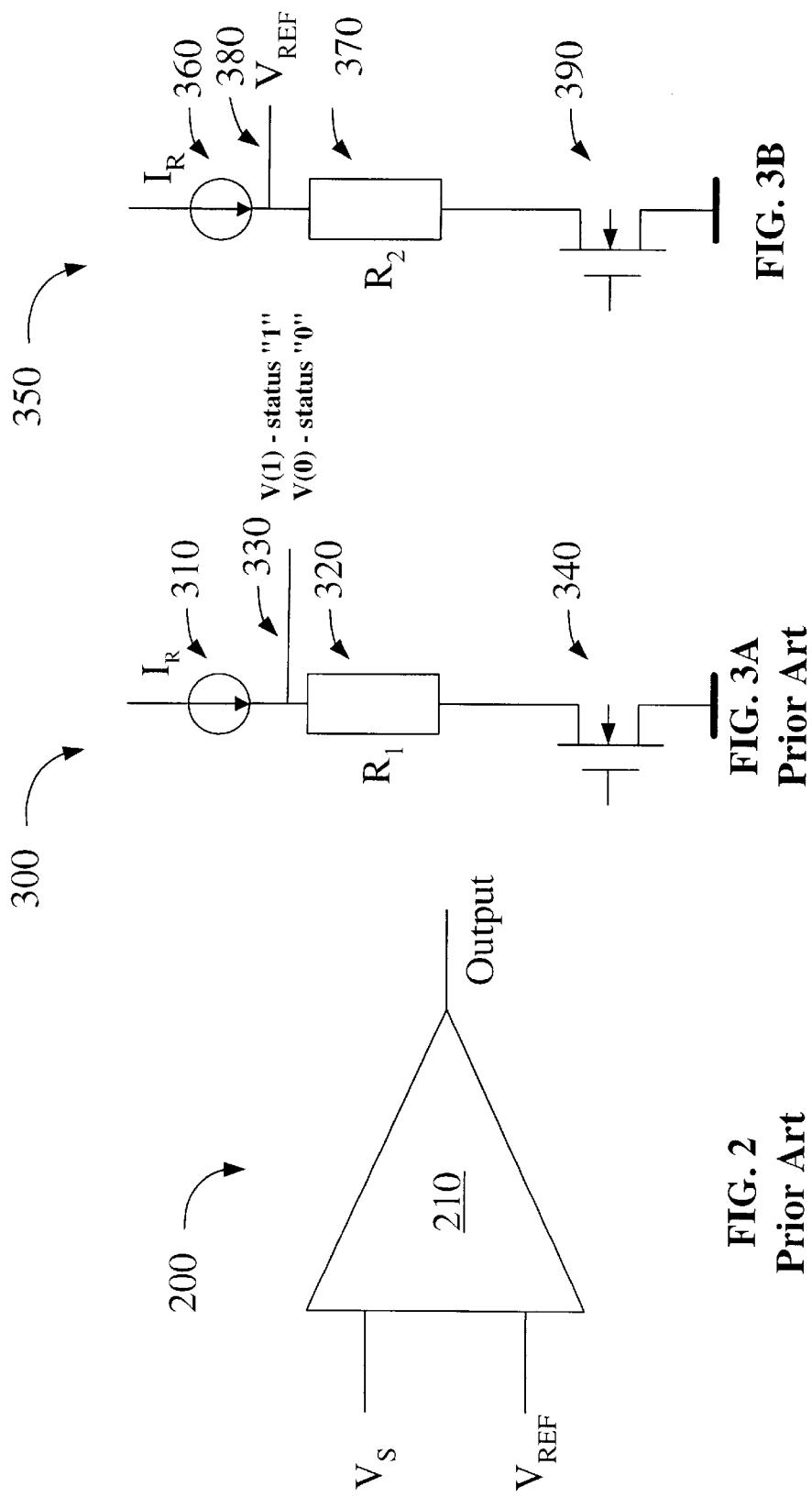

DESIGNS OF REFERENCE CELLS FOR MAGNETIC TUNNEL JUNCTION (MTJ) MRAM

CROSS-REFERENCE TO RELATED APPLICATIONS

This application claims the benefit of U.S. Provisional Application No. 60/271,169 filed Feb. 23, 2001, hereby incorporated by reference in its entirety.

BACKGROUND OF THE INVENTION

1. Field of the Invention

The present invention relates generally to data storage and more particularly to utilizing a reference cell to increase a read accuracy of memory cells from Magnetic Random Access Memory (MRAM) units.

2. Description of the Prior Art

A wide range of presently available media for data storage vary in several attributes including access speed, duration of reliable storage, and cost. Static Random Access Memory (SRAM) is the storage medium with the best access speed for the cost in applications such as cache memories. However, SRAM is volatile, meaning that it only maintains storage while power is continuously applied. Accordingly, computer users endure lengthy waits when they power-up their computers while substantial amounts of data are written from non-volatile but slow media, such as magnetic disks, into much faster random access memory (SRAM).

Flash memory has been proposed as an alternative to SRAM. Flash memory is a solid-state storage medium that provides moderate access times and is non-volatile. However, flash memory has the disadvantage that it has a limited lifetime, on the order of one million cycles per cell, after which it is no longer possible to write to a cell. This lifetime is orders of magnitude too short for a random access memory in most modern computing systems.

Another solid-state storage medium is Magnetic Random Access Memory (MRAM), which employs a Magnetic Tunnel Junction (MTJ) formed of layers of magnetic material. FIG. 1 shows a cross-section of a prior art MRAM unit 10 including an MTJ 12 formed of a pinned-layer 14 and a free-layer 16, which are magnetic layers typically formed of ferromagnetic materials, and a thin dielectric layer 18 disposed between layers 14 and 16. Pinned-layer 14 has a magnetic moment orientation 20 that is fixed from rotating, while free-layer 16 has a magnetic moment orientation 22 that is free to rotate in response to external magnetic fields. Methods of pinning a pinned-layer 14 are well known in the art and include the use of an adjacent antiferromagnetic layer (not shown).

In an MRAM unit 10, a bit of data is encoded in the direction of the magnetic moment orientation 22 of the free-layer 16 relative to the magnetic moment orientation 20 of the pinned-layer 14. As is well known in the art, when the two magnetic moment orientations 20, 22 are parallel the resistance measured across the MTJ 12 is relatively low, and when the two magnetic moment orientations 20, 22 are antiparallel the resistance measured across the MTJ 12 is relatively high. Accordingly, the relative state of the magnetic moment orientations 20, 22, either parallel or antiparallel to one another, can be determined by reading the resistance across the MTJ 12 with a read current. Typical read currents are on the order of 1–50 $\mu A$.

In an MRAM unit 10, the state of the bit, parallel or antiparallel and representing 0 or 1, for example, is varied by applying a write current $I_W$, typically on the order of 1–25 mA, through two conductors, a bit line 24 and a digit line 26, situated proximate to the MTJ 12. The intensity of the write current applied to the bit line 24 may be different than that applied to the digit line 26. The bit line 24 and the digit line 26 cross one another at right angles above and below the MTJ 12. As is well known in the art, although the pinned-layer 14 is depicted in FIG. 1 as nearer to the bit line 24, an MRAM unit 10 also functions with the pinned-layer 14 nearer to the digit line 26.

As is well known, a magnetic field develops around an electric current in a wire. Accordingly, two magnetic fields arise when write currents $I_W$ are simultaneously applied to both the bit line 24 and the digit line 26. The two magnetic fields combine at the free-layer 16 to determine the magnetic moment orientation 22. The magnetic moment orientation 22 of the free-layer 16 is made to alternate between the parallel and antiparallel states by alternating the direction of the write current $I_W$ in either the bit line 24 or the digit line 26. Alternating (by a write control circuit, not shown) the direction of the write current $I_W$ in one of the lines 24, 26 reverses the direction of the magnetic field around that conductor and thereby reverses the direction of the combined magnetic field at the free-layer 16.

In an MRAM unit 10, the state of the bit is read by passing a read current $I_R$ through the MTJ 12. In these designs a transistor 30 is used to allow the read current $I_R$ to flow through the MTJ 12 during a read operation while preventing the write current $I_W$ from flowing through the MTJ 12 during a write operation.

A control signal is required to determine which direction the reversible write current $I_W$ will flow. Another control signal is required to change the state of the transistor 30 for read and write operations.

A voltage signal $V_S$ is produced by sending a read current $I_R$ through the MTJ 12. For reading an MTJ MRAM cell, the signal $V_S$ from MTJ 12 is compared with a signal $V_{REF}$ from a reference cell at a comparator 200 utilizing amplifier 210 as shown in FIG. 2.

A typical memory cell 300 as shown in FIG. 3A includes a current source 310, an MTJ device 320, an output 330 coupled to a bit line, and a MOSFET (Metal-Oxide-Semiconductor Field-Effect-Transistor) switching transistor 340. A resistance of the MTJ device 320 can either be set to a logical "0" state, resulting in a low resistance setting, R, or set to a logical "1" state, resulting in a high resistance setting, R+$\Delta$R. Consequently, the signal $V_S$ for a low resistance state is $$V_S(0) = V_{MOS} + I_R R$$

whereas the signal $V_S$ for a high resistance state is $$V_S(1) = V_{MOS} + I_R(R + \Delta R)$$

In both equations, $V_{MOS}$ is a voltage drop across a drain and a source of the MOSFET switching transistor 340. It will be understood that the MOSFET switching transistor 340 may also be of another transistor type, such as a JFET (Junction Field Effect Transistor) or bipolar transistor.

FIG. 3B shows a reference cell 350 including a current source 360, an MTJ device 370 having a resistance $R_2$, a reference output 380 coupled to a bit line, and a MOSFET switching transistor 390. To obtain the best reading performance coupled with high reliability and accuracy, an output signal $V_{REF}$ from reference cell 350 should have a median value between $V_S(1)$ and $V_S(0)$. For $V_{REF}$ to be between $V_S(1)$ and $V_S(2)$, $R_2$ would need to be between R and R+ΔR. Ideally, this leads to $$V_{REF} = V_{MOS} + I_R R_2$$

$$V_{REF} = \frac{V_s(1) + V_s(0)}{2}$$

$$V_{REF} = \frac{V_{MOS} + I_R(R + \Delta R) + V_{MOS} + I_R R}{2}$$

$$V_{REF} = \frac{2V_{MOS} + 2I_R R + I_R \Delta R}{2}$$

$$V_{REF} = V_{MOS} + I_R \left(R + \frac{\Delta R}{2}\right)$$

Therefore, the resistance $R_2$ of reference cell 350 should preferably be $$R + \frac{\Delta R}{2}.$$

Since a memory cell has a resistance of either R or R+ΔR, one approach to producing a reference cell with a resistance of $$R + \frac{\Delta R}{2}$$

is to fabricate a reference cell as if it were a memory cell with a slightly different size or shape. However, if fabrication process parameters change, the resistance of a reference cell may not change commensurately with the resistance of a memory cell. This change in the reference cell resistance may result in an inaccurate reference signal. Consequently, the possibility of read error increases (e.g., reading a logical "0" from a memory cell set to a high state (logical "1"), or vice versa) and read sensitivity (the ability to discern an actual logic state) decreases.

Accordingly, what is desired is a reference cell designed and fabricated with the same shape and size as a memory cell but arranged in such a way so as to provide a summed effective resistance of $$R + \frac{\Delta R}{2}.$$

SUMMARY

The present invention provides for a reference cell circuit for a magnetic tunnel junction MRAM, comprising a first magnetic tunnel junction device set to a low resistance state and a second magnetic tunnel junction device set to a high resistance state. A reference cell series unit includes the first magnetic tunnel junction device electrically coupled in series with the second magnetic tunnel junction device. The reference cell series unit has a first end and a second end; the first end is electrically coupled to a first current source and the second end is electrically coupled to a current sink and a second current source.

Another embodiment of the present invention provides for a reference cell circuit for a magnetic tunnel junction MRAM comprising a first series electrical circuit and a second series electrical circuit. The first series electrical circuit includes a first magnetic tunnel junction device set to a low resistance state and a second magnetic tunnel junction device set to a high resistance state. The second magnetic tunnel junction device is electrically coupled to the first magnetic tunnel junction device in series. The second series electrical circuit includes a third magnetic tunnel junction device set to a low resistance state and a fourth magnetic tunnel junction device set to a high resistance state. The fourth magnetic tunnel junction device is electrically coupled to the third magnetic tunnel junction device in series. The first and second series electrical circuits are electrically coupled to each other in parallel.

Another embodiment of the present invention provides for a reference cell circuit for a magnetic tunnel junction MRAM comprising a first parallel electrical circuit and a second parallel electrical circuit. The first parallel electrical circuit includes a first magnetic tunnel junction device set to a low resistance state and a second magnetic tunnel junction device set to a low resistance state that is electrically coupled to the first magnetic tunnel junction device in parallel. The second parallel electrical circuit includes a third magnetic tunnel junction device set to a high resistance state and a fourth magnetic tunnel junction device set to a high resistance state that is electrically coupled to the third magnetic tunnel junction device in parallel. The first and second parallel electrical circuits are electrically coupled to each other in series.

Another embodiment of the present invention provides for a method for reading a magnetic tunnel junction MRAM cell comprising obtaining a first signal from a memory cell and obtaining a second signal from a reference cell. The reference cell includes a first magnetic tunnel junction device set to a low resistance state and a second magnetic tunnel junction device set to a high resistance state. A reference cell series unit includes the first magnetic tunnel junction device electrically coupled in series with a second magnetic tunnel junction device. The reference cell series unit has a first end and a second end; the first end is electrically coupled to a first current source, and the second end is electrically coupled to a current sink and a second current source. The first signal from the memory cell is compared with the second signal from the reference cell, and a determination of a logic state of the memory cell is based on the comparison step between the first signal and the second signal.

Another embodiment of the present invention provides for a method for reading a magnetic tunnel junction MRAM cell comprising obtaining a first signal from a memory cell and obtaining a second signal from a reference cell. The reference cell includes a first series electrical circuit and a second series electrical circuit with the first series electrical circuit having a first magnetic tunnel junction device and a second magnetic tunnel junction device electrically coupled in series. The first magnetic tunnel junction device is set to a low resistance state and the second magnetic tunnel junction device is set to a high resistance state. The second series electrical circuit has a third magnetic tunnel junction device and a fourth magnetic tunnel junction device electrically coupled in series. The third magnetic tunnel junction device is set to a low resistance state and the fourth magnetic tunnel junction device is set to a high resistance state. The first and second series electrical circuits are electrically coupled to each other in parallel. The first signal from the memory cell is compared with the second signal from the reference cell and a determination of a logic state of the memory cell is based on the comparison step between the first signal and the second signal.

Another embodiment of the present invention provides for a method for reading a magnetic tunnel junction MRAM cell comprising obtaining a first signal from a memory cell and obtaining a second signal from a reference cell. The reference cell includes a first parallel electrical circuit and a second parallel electrical circuit. The first parallel electrical circuit has a first magnetic tunnel junction device and a second magnetic tunnel junction device electrically coupled to each other in parallel. The first magnetic tunnel junction device and the second magnetic tunnel junction device are each set to a low resistance state. The second parallel electrical circuit has a third magnetic tunnel junction device and a fourth magnetic tunnel junction device electrically coupled to each other in parallel. The third magnetic tunnel junction device set and the fourth magnetic tunnel junction device are each set to a high resistance state. The first and second parallel electrical circuits are electrically coupled to each other in series. The first signal from the memory cell is compared with the second signal from the reference cell and a determination of a logic state of the memory cell is based on the comparison step between the first signal and the second signal.

Another embodiment of the present invention provides for a method for reading a magnetic tunnel junction MRAM cell comprising obtaining a first signal from a memory cell in a first-half of a circuit, obtaining a reference signal from a reference cell in a second-half of a circuit, and comparing the first signal from the memory cell with the reference signal from the reference cell, and determining a logic state of the memory cell based on the comparison step between the first signal and the reference signal.

Another embodiment of the present invention provides for a memory block cell layout comprising an amplifier/comparator, a plurality of memory cells with the memory cells sorted into columns and rows, a plurality of reference cells with the plurality of reference cells occurring in pairs for each row of the memory cells including a left-half reference cell and a right-half reference cell for each row of the memory cells. The plurality of reference cells and the plurality of memory cells are further divided into a plurality of left-half reference cells, a plurality of left-half memory cells, a plurality of right-half reference cells, and a plurality of right-half memory cells. The plurality of left-half reference cells and the plurality of left-half memory cells are electrically coupled to a first input lead of the amplifier/comparator and the plurality of right-half reference cells and the plurality of right-half memory cells are electrically coupled to a second input lead of the amplifier/comparator. The first input lead and the second input lead are always coupled to receive and accept both a memory cell input from the plurality of memory cells located in a first-half of the memory block and a reference cell input from the plurality of reference cells located in a second-half of the memory block.

Another embodiment of the present invention provides for a reference cell circuit for a magnetic tunnel junction MRAM comprising n-strings of magnetic tunnel junction devices with each of the n-strings including a first plurality of an integral number of about $$\frac{n}{2}$$

magnetic tunnel junction devices electrically coupled in series with each other and a second plurality of an integral number of about $$\frac{n}{2}$$

magnetic tunnel junction devices electrically coupled in series with each other and with the first plurality of magnetic tunnel junction devices. The first plurality of magnetic tunnel junction devices is set to a low resistance state and the second plurality of magnetic tunnel junction devices is set to a high resistance state. The n-strings of magnetic tunnel junction devices are coupled in parallel with each other such that a summed resistance across the reference cell circuit is about $$R + \frac{\Delta R}{2} \text{ ohms.}$$

Another embodiment of the present invention provides for a reference cell circuit for a magnetic tunnel junction MRAM comprising a first parallel electrical circuit and a second parallel electrical circuit. The first parallel circuit includes n-strings of magnetic tunnel junction devices; each of the n-strings has a first plurality of an integral number of about $$\frac{n}{2}$$

magnetic tunnel junction devices electrically coupled in series with each other. The first plurality of magnetic tunnel junction devices are each set to a low resistance state. The second parallel circuit includes n-strings of magnetic tunnel junction devices; each of the n-strings has a second plurality of an integral number of about $$\frac{n}{2}$$

magnetic tunnel junction devices electrically coupled in series with each other. The second plurality of magnetic tunnel junction devices are each set to a high resistance state. The first and second parallel electrical circuits are electrically coupled in series with each other such that a summed resistance across the reference cell circuit is about $$R + \frac{\Delta R}{2}$$

ohms.

Another embodiment of the present invention provides for a reference cell circuit for a magnetic tunnel junction MRAM comprising a means for electrically coupling a plurality of magnetic tunnel junction devices so as to produce a summed resistance across the electrically coupled plurality of magnetic tunnel junction devices of about $$R + \frac{\Delta R}{2}$$

ohms.

Another embodiment of the present invention provides for a memory device comprising at least one memory cell utilizing a magnetic tunnel junction MRAM and at least one reference cell associated with and electrically coupled to the memory cell. The reference cell has an effective resistance of about $$R + \frac{\Delta R}{2}$$

ohms.

BRIEF DESCRIPTION OF DRAWINGS

The present invention is illustrated by way of example, and not by way of limitation, in the figures of the accompanying drawings where like reference numerals frequently refer to similar elements and in which:

FIG. 2 is a signal comparison and amplification circuit of the prior art;

FIG. 3A is a typical memory cell of the prior art;

FIG. 3B is a reference cell;

DETAILED DESCRIPTION OF THE INVENTION

In order to overcome limitations of the prior art, several embodiments are described below that allow reference cells to be implemented using the same design and dimensions as memory cells found in proximity to the reference cell. By using a standard memory cell geometry for both memory cells and reference cells, the reference cell will serve the intended purpose without potential changes in resistance arising from fabrication process parameter variations.

Figure 1:
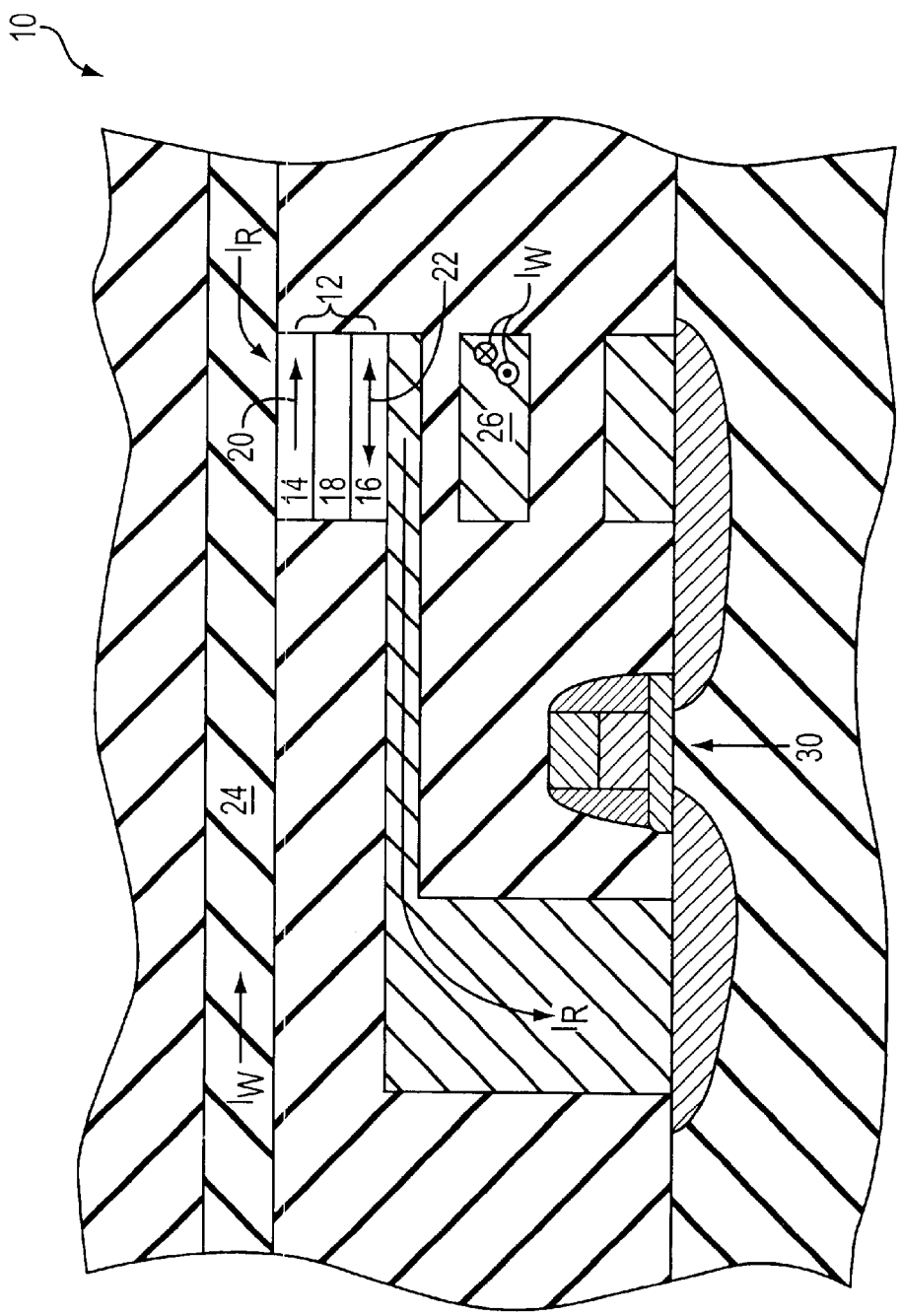
FIG. 1 is a cross-sectional representation of an MRAM of the prior art.
Figure 4:
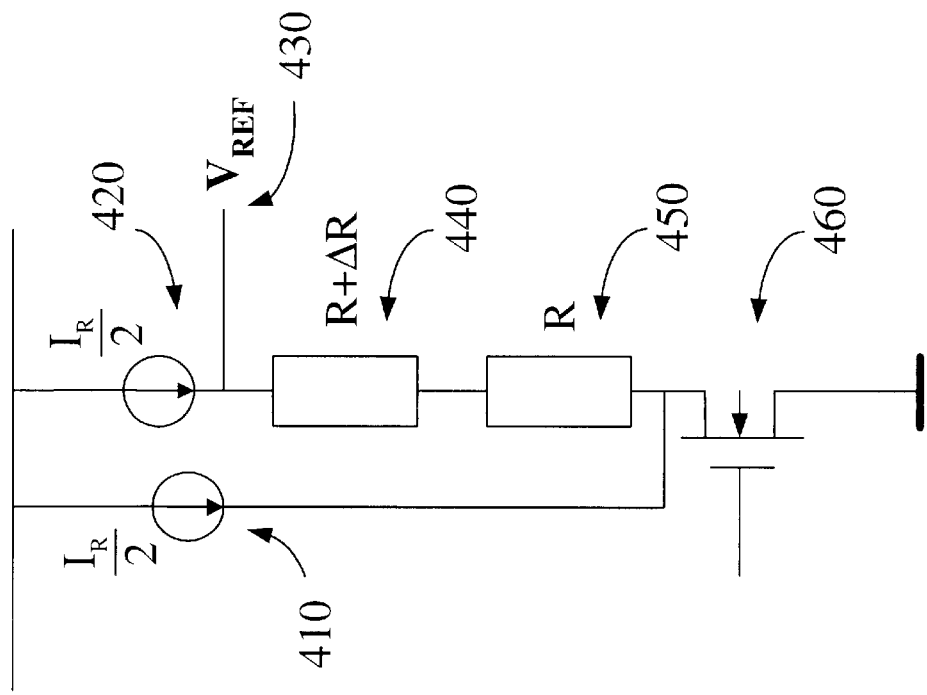
FIG. 4 is a reference cell of the present invention.

FIG. 4 shows of a reference cell 400 in accordance with one embodiment of the present invention. Reference cell 400 includes a first current source 410, a second current source 420, a reference voltage measurement point 430, a first MTJ device 440, a second MTJ device 450, and a MOSFET transistor 460. Reference cell 400 shows the first and second MTJ device 440, 450 connected in series with the MOSFET transistor 460, the MOSFET transistor 460 acting as a simple transistor switch. MOSFET transistor 460 is designed to be physically the same and have the same electrical performance as MOSFET switching transistor 340 (FIG. 3A) in any memory cell 300. The design of the first and second MTJ devices is the same as any memory cells contained in a nearby circuit. The first MTJ device 440 is programmed as a logical "1", or to a high resistance setting R+ΔR; while the second MTJ device 450 is programmed as a logical "0", or to a low resistance setting R. The summed resistance of serially connected first and second MTJ devices is 2R+ΔR, serving as effective reference resistance $R_2$ of the MTJ device 370 (FIG. 3B).

When a cell is read, a current is applied to the reference cell 400 by the first current source 410 that is approximately one-half the amount of current, $I_R$, applied to a memory cell 300 by current source 310 (FIG. 3A). Another one-half of the current, $I_R$, is applied from the second current source 420 to the MOSFET transistor 460 at its drain. Hence, the current applied by either the first current source 410 or the second current source 420 is $$\frac{I_R}{2}.$$

By using one-half the amount of current applied to two points in the reference cell 400 circuit, a voltage drop across the MOSFET transistor 460 in the reference cell 400 is equivalent to a voltage drop occurring across the MOSFET switching transistor 340 in a memory cell 300. As is well known in the art, a proportional current source can be easily obtained by means of a MOSFET mirror current source.

Reference signal $V_{REF}$, as measured from reference cell measurement point 430 to a source of MOSFET transistor 460, is determined from the following equations $$V_{REF} = V_{MOS} + \frac{I_R}{2}(2R + \Delta R)$$

$$V_{REF} = V_{MOS} + I_R\left(R + \frac{\Delta R}{2}\right)$$

Therefore, the equivalent resistance of this configuration is $$R + \frac{\Delta R}{2},$$

which is the same as resistance $R_2$ through an ideal MTJ device 370 (FIG. 3B).

Figure 5B:
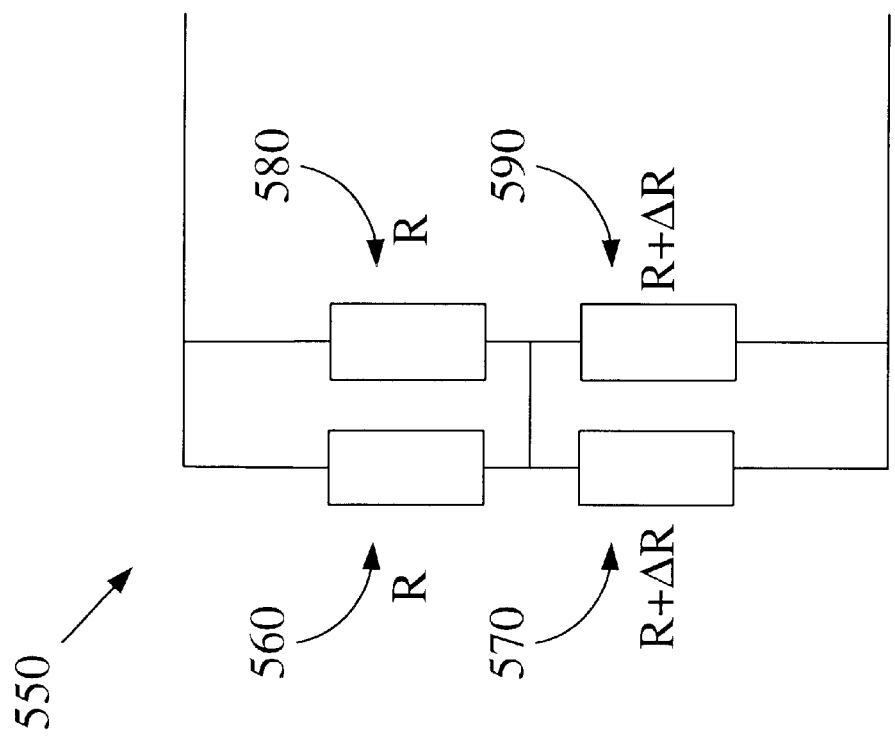
FIG. 5B is a reference cell section of the present invention.
Figure 5A:
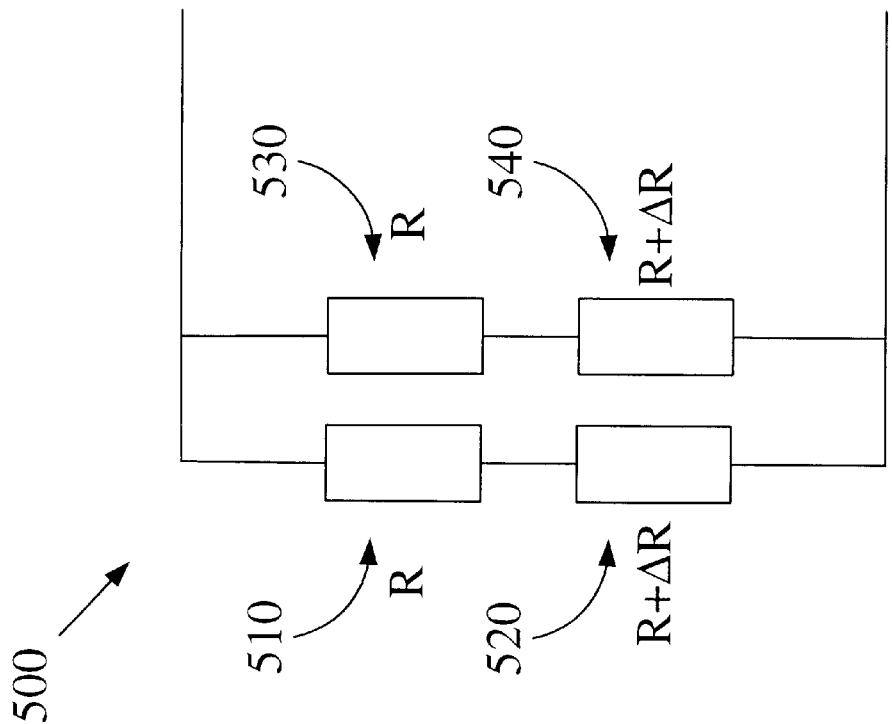
FIG. 5A is a reference cell section of the present invention.

FIG. 5A shows another reference cell segment 500 in accordance with another embodiment of the present invention. Reference cell segment 500 includes a first MTJ device 510, a second MTJ device 520, a third MTJ device 530, and a fourth MTJ device 540, each having the same design and dimensions as a memory cell. First and second MTJ devices 510, 520 are connected with each other in a series circuit and form a first branch of a parallel circuit. Similarly, third and fourth MTJ devices 530, 540 are also connected in series with each other and form a second branch of the parallel circuit. The first and third MTJ devices 510, 530 are each programmed to a logical "0" state, or a low resistance setting R. The second and fourth MTJ devices 520, 540 are each programmed to a logical "1" state, or a high resistance setting R+ΔR. When the first and second branches are combined to form a parallel circuit as shown in FIG. 5A, the equivalent resistance $R_{eq,A}$, is $$R_{eq.A} = \frac{(2R + \Delta R) \cdot (2R + \Delta R)}{(2R + \Delta R) + (2R + \Delta R)}$$

$$R_{eq.A} = \frac{2R + \Delta R}{2}$$

$$R_{eq.A} = R + \frac{\Delta R}{2}$$

thereby still arriving at an ideal resistance value equivalent to $R_2$ while utilizing standard MTJ device designs.

FIG. 5B shows another reference cell segment 550 in accordance with another embodiment of the present invention. Reference cell 550 includes a first MTJ device 560, a second MTJ device 570, a third MTJ device 580, and a fourth MTJ device 590, each having the same design and dimensions as a memory cell. First and third MTJ devices 560, 580 are connected with each other in a parallel circuit and form a first part of a series circuit. Similarly, second and fourth MTJ devices 570, 590 are also connected in parallel with each other and form a second part of the series circuit. The first and third MTJ devices 560, 580 are each programmed to a logical "0" state, or a low resistance setting R. The second and fourth MTJ devices 570, 590 are each programmed to a logical "1" state, or a high resistance setting R+ΔR. When the first and second branches are combined to form a series circuit as shown in FIG. 5B, the equivalent resistance $R_{eq,B}$ is $$R_{eq,B} = \frac{R \cdot R}{R+R} + \frac{(R+\Delta R) \cdot (R+\Delta R)}{(R+\Delta R)+(R+\Delta R)}$$

$$R_{eq,B} = \frac{2R+\Delta R}{2}$$

$$R_{eq,B} = R + \frac{\Delta R}{2}$$

The equivalent resistance, $R_{eq,B}$, of reference cell segment 550 therefore also produces the ideal resistance value of $R_2$.

It can be seen that reference cell segments 500, 550 are structurally different but yield the same equivalent resistance of $$R + \frac{\Delta R}{2}.$$

Therefore, reference cell segments 500 or 550 can be substituted for $R_2$ 360 of FIG. 3B while still allowing all MTJ devices 510 . 540 or 560–590 to be designed and fabricated in the same fashion as any memory cells in a nearby circuit.

One of ordinary skill in the art can readily envision other permutations of the circuits described in FIGS. 5A and 5B that make use of a plurality of MTJ devices. For example, a circuit (not shown) expanding on that shown in FIG. 5A could be fashioned utilizing an n×n array of MTJ devices, where n is an even integer number. In this embodiment, a total resistance, in ohms, of n MTJ devices connected in series would be $$nR + \frac{n}{2}\Delta R$$

assuming there is an equal number of MTJ devices programmed to either a high or low resistance setting. Utilizing n MTJ devices in series forms one branch of a parallel circuit. Connecting n branches in parallel with each other, wherein each branch is formed of n MTJ devices connected in series and programmed as stated produces a total equivalent resistance of $$\frac{nR + \frac{n}{2}(\Delta R)}{n} = R + \frac{\Delta R}{2}$$

The foregoing embodiment assumes an even number of MTJ devices with equal numbers of MTJ devices programmed to either a high or low resistance setting. One skilled in the art can readily envision a series-parallel circuit similar to that outlined above but utilizing an m×m array of MTJ devices. In this embodiment, m is any odd integer number greater than 2. For an odd number of MTJ devices, $$\frac{m}{2} \pm 0.5$$

MTJ devices would be set to a high resistance setting while the remaining $$\frac{m}{2} \mp 0.5$$

MTJ devices would be set to a low resistance setting. The symbols "±" and "∓" are used to indicate that non-integer values (non-integer values occurring due to dividing an odd integer value by 2) are alternatively rounded up or down by 0.5 to arrive at the next integer value. If a non-integer value is rounded up by 0.5, then the same non-integer value is next rounded down by 0.5. For example, if m has a value of 25, then 13 MTJ devices would be programmed to a high resistance setting and 12 MTJ devices would be programmed to a low resistance setting. In this embodiment, a total resistance, in ohms, of m MTJ devices connected in series would be $$(m \pm 0.5) \cdot R + \left(\frac{m \mp 0.5}{2}\right) \cdot \Delta R$$

Utilizing m MTJ devices in series forms one branch of a parallel circuit. Connecting m branches in parallel with each other, wherein each branch is formed of m MTJ devices connected in series and programmed as stated produces a total equivalent resistance of $$\frac{(m \pm 0.5) \cdot R + \frac{(m \mp 0.5)}{2} \cdot (\Delta R)}{m} \cong R + \frac{\Delta R}{2}$$

For values of m>>3, the approximate nature of the previous equation asymptotically approaches an equality.

Those skilled in the art will quickly recognize that the aforementioned embodiments encompassing a plurality of MTJ devices may be applied in a similar fashion to FIG. 5B as well.

Figure 6:
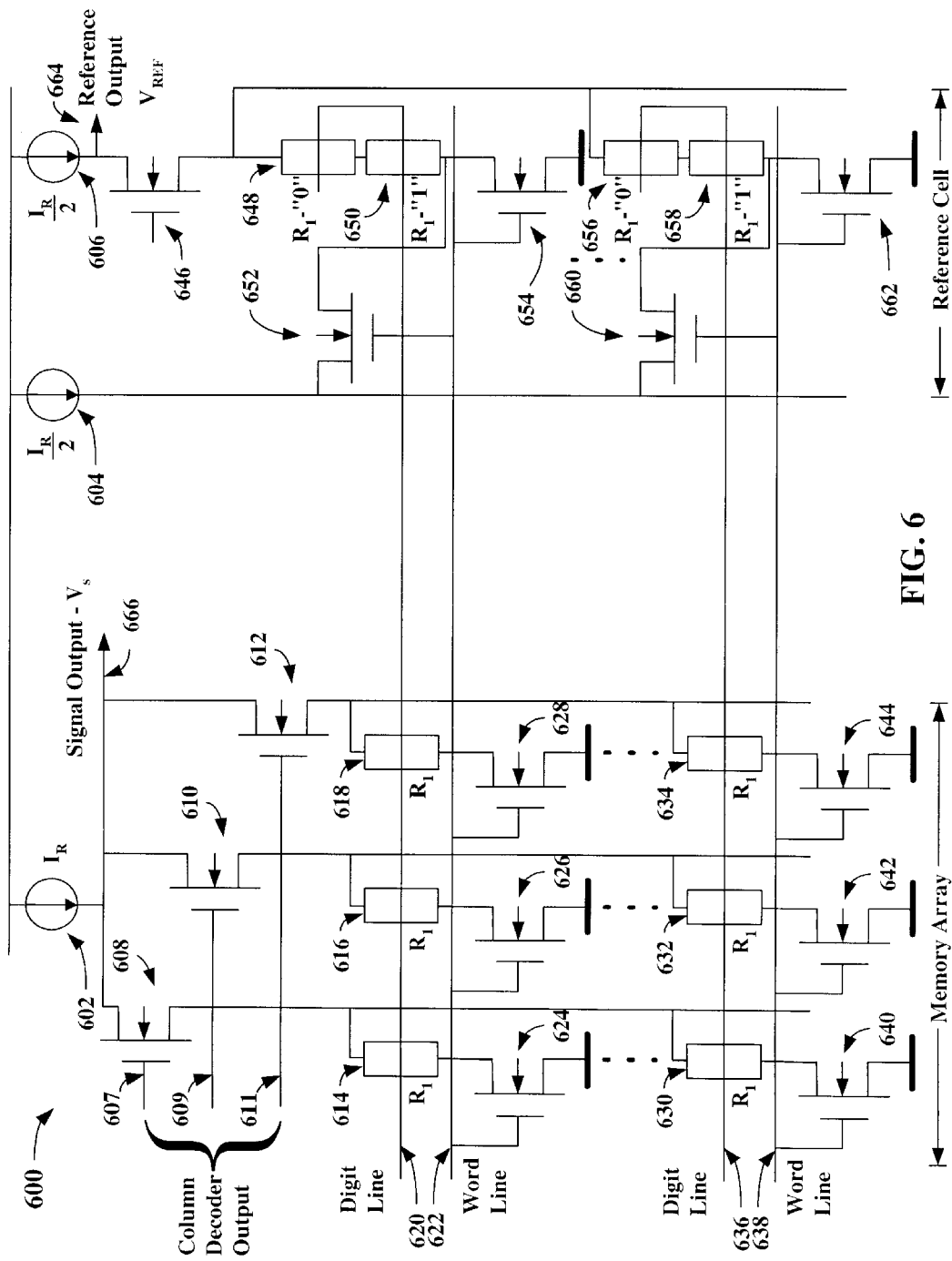
FIG. 6 is a memory block implementing a reference cell of the present invention as shown in FIG. 4.

FIG. 6 shows an embodiment of an implementation of memory block 600 utilizing a reference cell 400 as described in conjunction with FIG. 4. FIG. 6 includes current sources 602–606, column decoder outputs 607, 609, 611, MOSFET transistors 608, 610, 612, 646, 652, 660, MTJ devices 614–618, 630–634, digit lines 620, 636, word lines 622, 638, MOSFET switching transistors 624–628, 640–644, 654, 662, MTJ devices programmed to a low resistivity setting 648, 656, MTJ devices programmed to a high resistivity setting 650, 658, a reference voltage output tap 664, and a signal voltage output tap 666. In this embodiment of a memory block 600, each line in an array of MTJ devices 614–618, 630–634 has an associated reference cell. One reference cell 400 (FIG. 4) is comprised of current sources 604, 606, MOSFET transistors 646, 652, MOSFET switching transistor 654, an MTJ device programmed to a low resistivity setting 648, and an MTJ device programmed to a high resistivity setting 650. Notice that the current sources 604, 606 associated with the reference cells each supply about half the current level to the reference cells as compared with the amount of current supplied to the memory cells through current source 602.

The circuit functions in the following way. Whenever a read request is sent, a read current directed to a given MTJ device 614–618, 630–634 in the memory array 600 and produces a voltage, $V_S$, at the signal voltage output tap 666. Concurrently, a read current directed to an associated reference cell produces a reference voltage, $V_{REF}$, at the reference voltage output tap 664. $V_S$ and $V_{REF}$ are compared in a comparator 200 (FIG. 2). If $V_S$ is greater than $V_{REF}$, the state of the memory cell is determined to be a logical "1." If $V_S$ is less than $V_{REF}$, the state of the memory cell is determined to be a logical "0." The memory block 600 may be made any size by repeating the number of lines and columns. For improving read efficiency and accuracy, each memory cell line should have at least one associated reference cell.

Figure 7:
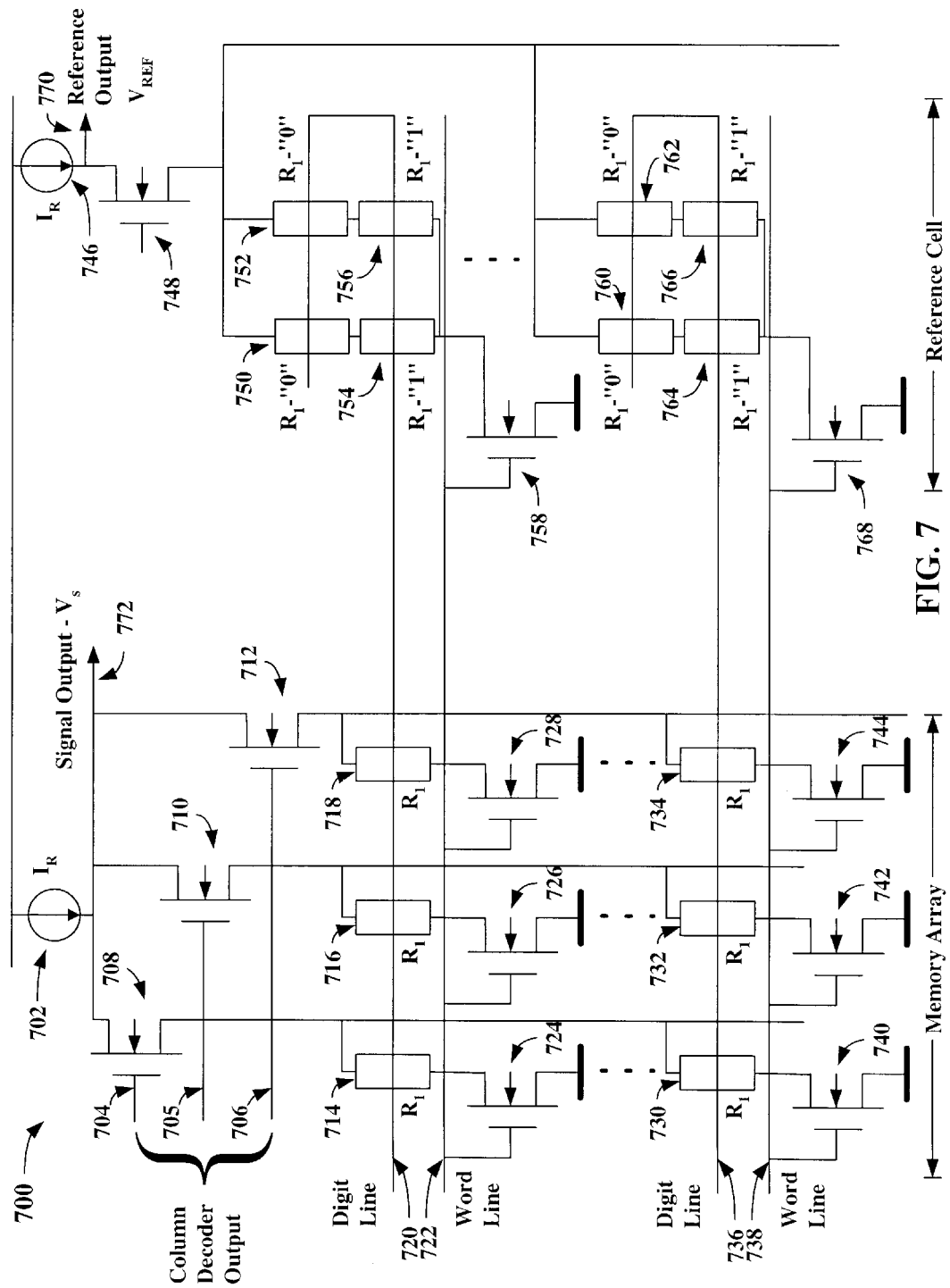
FIG. 7 is a memory block implementing a reference cell of the present invention as shown in FIG. 5A.

FIG. 7 shows an embodiment of an implementation of memory block 700 utilizing a reference cell 500 as described in conjunction with FIG. 5A. FIG. 7 includes current sources 702, 746, column decoder outputs 704–706, MOSFET transistors 708, 710, 712, 748, MTJ devices 714–718, 730–734, digit lines 720, 736, word lines 722, 738, MOSFET switching transistors 724–728, 740–744, 758, 768, MTJ devices programmed to a low resistivity setting 750, 752, 760, 762, MTJ devices programmed to a high resistivity setting 754, 756, 764, 766, a reference voltage output tap 770, and a signal voltage output tap 772. In this embodiment of a memory block 700, each line in an array of MTJ devices 714–718, 730–734 has an associated reference cell 500. Therefore, whenever a read request is sent, a read current is directed to a given MTJ device 714–718, 730–734 in the memory array to produce a voltage signal, $V_S$, at the signal voltage output tap 772. Concurrently, a read current is directed to an associated reference cell section 500 produces a reference voltage, $V_{REF}$, at the reference voltage output tap 770. $V_S$ and $V_{REF}$ are compared in a comparator 200 (FIG. 2). If $V_S$ is greater than $V_{REF}$, the state of the memory cell is determined to be a logical "1." If $V_S$ is less than $V_{REF}$, the state of the memory cell is determined to be a logical "0." The memory block 700 may be made any size by repeating the number of lines and columns. For improving read efficiency and accuracy, each memory cell line should have at least one associated reference cell 500. A similar embodiment may be envisioned utilizing the reference cell segment 550 of FIG. 5B.

Figure 8:
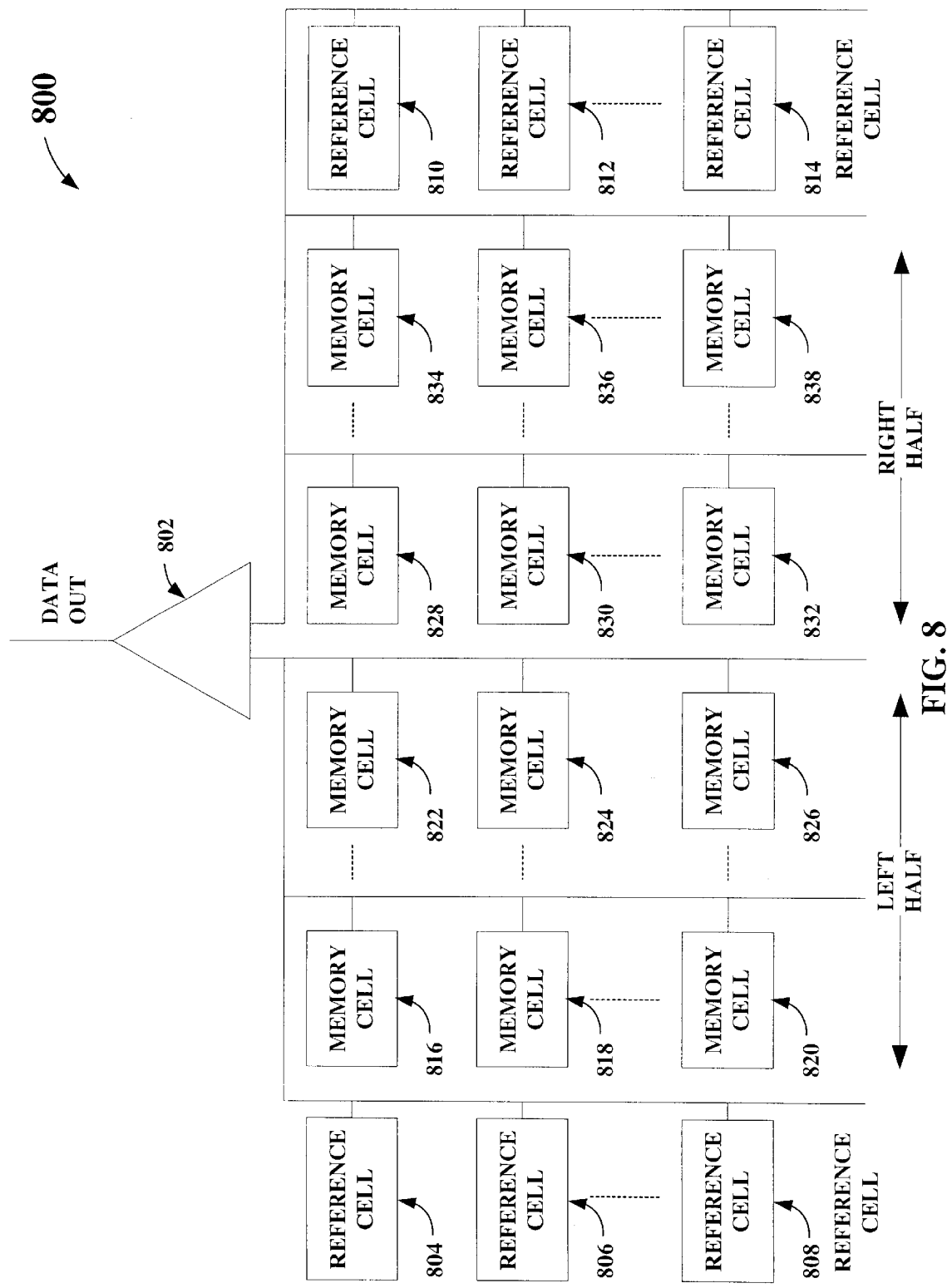
FIG. 8 is an embodiment of a cell layout implementing a reference cell of the present invention.

FIG. 8 is an embodiment of a cell layout 800 using reference cells 804–814 of the present invention. Cell layout 800 includes an amplifier/comparator 802, reference cells 804–814, and memory cells 816–838. In the embodiment shown in FIG. 8, every row in a memory array has two reference cells, located in a right-most and a left-most position. For a memory block, two reference columns are included as part of the block design. However, the two reference columns need not necessarily be located at the right-most and left-most column positions. A reference column may be at any column position in one-half of the memory array and another reference column may be at any column position in another half of the memory array. As shown in FIG. 2, a voltage signal, $V_{REF}$, from a reference cell 804–814 is always compared with a read signal, $V_S$, from a memory cell 816–838. In FIG. 8, when a memory cell 816–826 in a left-half of a memory block row is read, a reference cell 810–814 from a right-half of the memory block row is also selected for comparison. Similarly, when a memory cell 828–838 from the right-half of a memory block is read, a reference cell 804–808 from the left-half is selected for comparison. By this means, the memory block only needs one amplifier/comparator 802 for the read operation. Memory blocks of any size may be implemented by the same basic structure shown in FIG. 8 by increasing the number of lines and/or columns.

In the embodiments described herein, because the MTJ devices used in reference cells are designed similarly to the MTJ devices used in memory cells, variations in designs or processes will cause the resistance of all cells to change in a similar way.

From the descriptions of the exemplary embodiments of the method and reference cells set forth herein, it will be apparent to one of ordinary skill in the art that variations and additions to the embodiments can be made without departing from the principles of the present invention. For example, it could be easy to envision a reference cell making use of a plurality of MTJ devices that are variously programmed to either a high or low resistance setting and combined in a series-parallel circuit to arrive a resistance of close to $$R + \frac{\Delta R}{2}.$$

Also, it could be equally easy to envision a plurality of proportional current sources and a plurality of MTJ devices, wherein the MTJ devices are variously programmed to either a high resistance state or a low resistance state with the aforementioned MTJ devices and combined in a series-parallel circuit to arrive at the aforementioned resistance of $$R + \frac{\Delta R}{2}.$$

Additionally, any of the MOSFET transistors heretofore described could readily be replaced by other elements, such as one or more bipolar transistors. It would be an obvious extrapolation from the tenets of the reference cells described to construct an equivalent circuit that is still taught by the spirit of the embodiments presented herein.

What is claimed is:

1. A reference cell circuit for a magnetic tunnel junction MRAM, comprising:
   a reference cell series unit including;
      a first end and a second end;
      a first magnetic tunnel junction device set to a low resistance state; and
      a second magnetic tunnel junction device set to a high resistance state, the first and second magnetic tunnel junction devices being electrically coupled in a series circuit and electrically coupled between the first and second ends;
   a first current source electrically coupled to the first end;
   a second current source electrically coupled to the second end; and
   a current sink electrically coupled to the second end.

2. The reference cell circuit of claim 1, wherein the first magnetic tunnel junction device has a resistance of R ohms and the second magnetic tunnel junction device has a resistance of about R+ΔR ohms.

3. The reference cell circuit of claim 2, wherein a summed resistance of the first magnetic tunnel junction device and the second magnetic tunnel junction device is about 2R+ΔR ohms.

4. The reference cell circuit of claim 1, wherein the first current source and the second current source are the same current source.

5. The reference cell circuit of claim 1, wherein the first current source and the second current source each supply about equal amounts of current.

6. The reference cell circuit of claim 1, wherein the current sink is a ground connection.

7. The reference cell circuit of claim 1, wherein the current sink is a drain lead of a transistor.

8. The reference cell circuit of claim 1, wherein both the first and second magnetic tunnel junction devices are formed of layers of magnetic and dielectric materials.

9. The reference cell circuit of claim 8, wherein both the first and the second magnetic tunnel junction devices comprise a free-layer and a pinned-layer, wherein the free-layer and the pinned-layer are formed of ferromagnetic materials with a dielectric layer disposed between the free-layer and the pinned-layer.

10. The reference cell circuit of claim 1, wherein the first and the second current sources are each obtained from a MOSFET mirror current source.

11. A reference cell circuit for a magnetic tunnel junction MRAM comprising:
a first end and a second end;
a first series electrical circuit, including
a first magnetic tunnel junction device set to a low resistance state, and a second magnetic tunnel junction device set to a high resistance state and electrically coupled to the first magnetic tunnel junction device in series; and
a second series electrical circuit electrically coupled in parallel to the first series electrical circuit and electrically coupled between the first and second ends, including
a third magnetic tunnel junction device set to a low resistance state, and a fourth magnetic tunnel junction device set to a high resistance state and electrically coupled to the third magnetic tunnel junction device in series.

12. The reference cell circuit of claim 11 wherein the first end is electrically coupled to a current source, and the second end is electrically coupled to a current sink.

13. The reference cell circuit of claim 12 further comprising a first transistor electrically coupled between the current source and the first end, and a second transistor electrically coupled between the second end and the current sink.

14. The reference cell circuit of claim 11, wherein a summed resistance across the first series electrical circuit and the second series electrical circuit is about $$R + \frac{\Delta R}{2}$$

ohms.

15. The reference cell circuit of claim 11, wherein the first and the second magnetic tunnel junction devices are formed of layers of ferromagnetic and dielectric materials.

16. The reference cell circuit of claim 15, wherein the first and the second magnetic tunnel junction devices comprise a free-layer and a pinned-layer, wherein the free-layer and the pinned-layer formed of ferromagnetic materials with a thin dielectric layer disposed between the free-layer and the pinned-layer.

17. A reference cell circuit for a magnetic tunnel junction MRAM comprising:
a reference cell series unit including;
a first end and a second end electrically coupled to a first parallel electrical circuit and a second parallel electrical circuit;
the first parallel electrical circuit, including
a first magnetic tunnel junction device set to a low resistance state, and a second magnetic tunnel junction device set to a low resistance state and electrically coupled to the first magnetic tunnel junction device in parallel; and
the second parallel electrical circuit electrically coupled in a series electrical circuit with the first parallel electrical circuit, including
a third magnetic tunnel junction device set to a high resistance state, and a fourth magnetic tunnel junction device set to a high resistance state and electrically coupled to the third magnetic tunnel junction device in parallel.

18. The reference cell circuit of claim 17 wherein the first end is electrically coupled to a current source and the second end is electrically coupled to a current sink.

19. The reference cell circuit of claim 18 further comprising a first transistor electrically coupled between the current source and the first end and a second transistor electrically coupled between the second end and the current sink.

20. The reference cell circuit of claim 17, wherein a summed resistance across the first parallel electrical circuit and the second parallel electrical circuit electrically coupled to each other in series is about $$R + \frac{\Delta R}{2}$$

ohms.

21. The reference cell circuit of claim 17, wherein the first and the second magnetic tunnel junction devices are formed of layers of ferromagnetic and dielectric materials.

22. The reference cell circuit of claim 21, wherein the first and second magnetic tunnel junction devices comprise a free-layer and a pinned-layer, wherein the free-layer and the pinned-layer formed of ferromagnetic materials with a dielectric layer disposed between the free-layer and the pinned-layer.

23. A method for reading a magnetic tunnel junction MRAM cell comprising:
obtaining a first signal from a memory cell,
obtaining a second signal from a reference cell, the reference cell including;
a first end and a second end;
a first magnetic tunnel junction device set to a low resistance state; and
a second magnetic tunnel junction device set to a high resistance state, the first and second magnetic tunnel junctions being electrically coupled in a series circuit and electrically coupled between the first and second ends;
a first current source electrically coupled to the first end;
a second current source electrically coupled to the second end; and
a current sink electrically coupled to the second end;
comparing the first signal from the memory cell with the second signal from the reference cell; and
determining a logic state of the memory cell based on the comparison step between the first signal and the second signal.

24. The method of claim 23, wherein the second signal is measured between the first end and an electrical ground plane.

25. The method of claim 23, wherein the comparison of the first signal with the second signal occurs in a comparator.

26. A method for reading a magnetic tunnel junction MRAM cell comprising:

obtaining a first signal from a memory cell,
obtaining a second signal from a reference cell, the reference cell including
  a first end and a second end;
  a first series electrical circuit, including
    a first magnetic tunnel junction device set to a low resistance state, and a second magnetic tunnel junction device set to a high resistance state and electrically coupled to the first magnetic tunnel junction device in series; and
  a second series electrical circuit electrically coupled in parallel to the first series electrical circuit and electrically coupled between the first and second ends, including
    a third magnetic tunnel junction device set to a low resistance state, and a fourth magnetic tunnel junction device set to a high resistance state and electrically coupled to the third magnetic tunnel junction device in series;
comparing the first signal from the memory cell with the second signal from the reference cell; and
determining a logic state of the memory cell based on the comparison step between the first signal and the second signal.

27. The method of claim 26, wherein the second signal is measured between the first end and an electrical ground plane.

28. The method of claim 26, wherein the comparison of the first signal with the second signal occurs in a comparator.

29. A method for reading a magnetic tunnel junction MRAM cell comprising:
obtaining a first signal from a memory cell,
obtaining a second signal from a reference cell, the reference cell including
  a first end and a second end electrically coupled to a first parallel electrical circuit and a second parallel electrical circuit;
  the first parallel electrical circuit, including
    a first magnetic tunnel junction device set to a low resistance state, and a second magnetic tunnel junction device set to a low resistance state and electrically coupled to the first magnetic tunnel junction device in parallel; and
  the second parallel electrical circuit electrically coupled in a series electrical circuit with the first parallel electrical circuit, including
    a third magnetic tunnel junction device set to a high resistance state, and a fourth magnetic tunnel junction device set to a high resistance state and electrically coupled to the third magnetic tunnel junction device in parallel;
comparing the first signal from the memory cell with the second signal from the reference cell; and
determining a logic state of the memory cell based on the comparison step between the first signal and the second signal.

30. The method of claim 29, wherein the second signal is measured between the first end and an electrical ground plane.

31. The method of claim 29, wherein the comparison of the first signal with the second signal occurs in a comparator.

32. A method for reading a magnetic tunnel junction MRAM cell comprising:
obtaining a first signal from a memory cell in a first-half of a circuit;
obtaining a reference signal from a reference cell in a second-half of a circuit;
comparing the first signal from the memory cell with the reference signal from the reference cell; and
determining a logic state of the memory cell based on the comparison step between the first signal and the reference signal.

33. The method of claim 32, wherein the reference signal is a voltage signal.

34. The method of claim 33 wherein an intensity of the voltage signal is midway between an intensity of the first signal from a memory cell in a low logical state and an intensity of the first signal from a memory cell in a high logical state.

35. A memory block cell layout comprising:
a plurality of rows, each row including
  a left-half having
    a plurality of left-half memory cells and a left-half reference cell, and
  a right-half having
    a plurality of right-half memory cells and a right-half reference cell; and
a comparator configured to receive from any one row either
  a left-half memory cell signal from one of the plurality of left-half memory cells, and
  a right-half reference cell signal from the right-half reference cell, or
  a right-half memory cell signal from one of the plurality of right-half memory cells, and
  a left-half reference cell signal from the left-half reference cell.

36. A reference cell circuit for a magnetic tunnel junction MRAM comprising:
n-strings of magnetic tunnel junction devices, each of the n-strings including
  a first plurality of an integral number of about $$\frac{n}{2}$$

magnetic tunnel junction devices electrically coupled in series with each other, the first plurality of magnetic tunnel junction devices set to a low resistance state;
  a second plurality of an integral number of about $$\frac{n}{2}$$

magnetic tunnel junction devices electrically coupled in series with each other and with the first plurality of magnetic tunnel junction devices, the second plurality of magnetic tunnel junction devices set to a high resistance state; and
  the n-strings of magnetic tunnel junction devices coupled in parallel with each other such that a summed resistance across the reference cell circuit is about $$R + \frac{\Delta R}{2}$$

ohms.

37. A reference cell circuit for a magnetic tunnel junction MRAM comprising:
a first parallel electrical circuit, the first parallel circuit including n-strings of magnetic tunnel junction devices, each of the n-strings having a first plurality of an integral number of about $$\frac{n}{2}$$

magnetic tunnel junction devices electrically coupled in series with each other, the first plurality of magnetic tunnel junction devices each set to a low resistance state;

a second parallel electrical circuit, the second parallel circuit including n-strings of magnetic tunnel junction devices, each of the n-strings having a second plurality of an integral number of about $$\frac{n}{2}$$

magnetic tunnel junction devices electrically coupled in series with each other, the second plurality of magnetic tunnel junction devices each set to a high resistance state; and the first and second parallel electrical circuits being electrically coupled in series with each other such that a summed resistance across the reference cell circuit is about $$R + \frac{\Delta R}{2}$$

ohms.

38. A reference cell circuit for a magnetic tunnel junction MRAM comprising:

a means for electrically coupling a plurality of magnetic tunnel junction devices so as to produce a series resistance across the plurality of magnetic tunnel junction devices of about $$R + \frac{\Delta R}{2}$$

ohms.

39. A memory device comprising:

a memory circuit including a memory current source configured to supply a memory current to a memory magnetic tunnel junction device;

a reference circuit including a reference cell unit having a first end and a second end;

a first magnetic tunnel junction device set to a low resistance state, and a second magnetic tunnel junction set to a high resistance state, the first and second magnetic tunnel junction devices being electrically coupled in a series circuit and electrically coupled between the first and second ends;

a comparator configured to receive a memory signal from the memory circuit; and a reference signal from the reference circuit, to determine a logical state of the memory magnetic tunnel junction device.

40. The memory device of claim 39 further comprising:

a first current source configured to supply a first reference current to the first end;

a second current source configured to supply a second current source to the second end; and a current sink coupled to the second end.

41. The memory device of claim 40 wherein both the first reference current and the second reference current are about half the memory current.

* * * * *